United States Patent
Bopp et al.

(10) Patent No.: US 8,854,829 B1
(45) Date of Patent: Oct. 7, 2014

(54) STANDOFF MOUNTING SYSTEM

(75) Inventors: Jayson K. Bopp, Fishers, IN (US);
Martin G. Fix, Indianapolis, IN (US)

(73) Assignee: Raytheon Company, Waltham, MA (US)

( * ) Notice: Subject to any disclaimer, the term of this patent is extended or adjusted under 35 U.S.C. 154(b) by 265 days.

(21) Appl. No.: 12/873,583

(22) Filed: Sep. 1, 2010

Related U.S. Application Data (60) Provisional application No. 61/238,927, filed on Sep. 1, 2009.

(51) Int. Cl.
*H05K 5/00* (2006.01)

(52) U.S. Cl.
USPC .......... 361/759; 361/758; 411/82.5; 411/383; 411/384; 411/396; 174/382; 248/324

(58) Field of Classification Search
USPC ......... 361/758–759, 784, 790, 796, 801–802; 411/389, 971, 82.5, 383, 384, 396; 174/382; 248/324
See application file for complete search history.

(56) References Cited

U.S. PATENT DOCUMENTS

| | | | | |
|---|---|---|---|---|
| 3,313,078 | A * | 4/1967 | Rohe | 52/787.1 |
| 3,646,982 | A * | 3/1972 | Cushman | 411/82.5 |
| 4,252,458 | A * | 2/1981 | Keen | 403/287 |
| 5,518,351 | A * | 5/1996 | Peil | 411/383 |
| 5,697,746 | A * | 12/1997 | Brown et al. | 411/396 |
| 6,146,076 | A * | 11/2000 | Bodin | 411/433 |
| 6,196,781 | B1 * | 3/2001 | Yang | 411/384 |
| 6,296,431 | B1 * | 10/2001 | Miller | 411/353 |
| 6,443,680 | B1 * | 9/2002 | Bodin | 411/396 |
| 6,848,346 | B1 * | 2/2005 | Panasik | 81/438 |
| 6,894,217 | B2 * | 5/2005 | Li | 174/382 |
| 6,935,821 | B2 * | 8/2005 | Bodin et al. | 411/29 |
| 6,950,301 | B2 | 9/2005 | Bossio | 361/679 |
| 6,982,878 | B2 | 1/2006 | Chen et al. | 361/801 |
| 7,245,497 | B2 | 7/2007 | Klein et al. | 361/752 |
| 7,297,015 | B1 | 11/2007 | Desrosiers et al. | 439/377 |
| 7,352,589 | B2 | 4/2008 | Clidaras et al. | 361/748 |
| 7,364,447 | B1 | 4/2008 | Desrosiers et al. | 439/157 |
| 7,385,830 | B2 | 6/2008 | Liu et al. | 361/810 |
| 7,432,702 | B2 | 10/2008 | Shiao et al. | 324/158.1 |
| 7,435,114 | B2 | 10/2008 | Desrosiers et al. | 439/157 |
| 7,554,815 | B2 | 6/2009 | Hardt et al. | 361/753 |
| 7,567,434 | B1 * | 7/2009 | Sivertsen | 361/679.32 |
| 7,581,909 | B2 * | 9/2009 | Szoke | 411/401 |
| 7,665,940 | B2 * | 2/2010 | Nilsen et al. | 411/13 |
| 7,679,924 | B2 | 3/2010 | Davis et al. | 361/756 |
| 7,733,667 | B2 * | 6/2010 | Qin et al. | 361/804 |
| 7,746,654 | B2 | 6/2010 | Franz et al. | 361/724 |
| 7,780,134 | B2 * | 8/2010 | Panasik et al. | 248/324 |
| 2002/0121008 | A1 | 9/2002 | Meyer et al. | 24/453 |
| 2004/0218369 | A1 | 11/2004 | Dean | |
| 2005/0042918 | A1 | 2/2005 | Jensen et al. | 439/571 |
| 2006/0090927 | A1 | 5/2006 | Edwards et al. | 174/138 |
| 2006/0094296 | A1 * | 5/2006 | Edwards et al. | 439/573 |
| 2006/0114662 | A1 * | 6/2006 | Liu et al. | 361/759 |
| 2006/0223343 | A1 | 10/2006 | Campini et al. | 439/64 |
| 2006/0262512 | A1 | 11/2006 | Klein et al. | 361/800 |
| 2007/0145966 | A1 | 6/2007 | Shekhawat et al. | |

* cited by examiner

*Primary Examiner* — Xiaoliang Chen (57) ABSTRACT

In certain embodiments, a mounting apparatus includes one or more standoffs adapted to maintain two panels at a spaced apart distance from one another. The standoff includes a first end having a first threaded fastening member and a second end having a cavity in which a torque restraining member is disposed. The torque restraining member is coupled to a second threaded fastening member. The relative sizes of the torque restraining member and the cavity allow movement of the torque restraining member within the cavity.

20 Claims, 7 Drawing Sheets

STANDOFF MOUNTING SYSTEM

RELATED APPLICATIONS

This application claims the benefit under 35 U.S.C. §119 (e) of the priority of U.S. Provisional Patent Application Ser. No. 61/238,927, entitled "Standoff Mounting. System," filed Sep. 1, 2009, the entire disclosure of which is hereby incorporated by reference.

TECHNICAL FIELD OF THE DISCLOSURE

This disclosure generally relates to mounting systems, and more particularly, to a standoff mounting system.

BACKGROUND OF THE DISCLOSURE

Electrical circuit cards are often housed in a chassis for protection from the environment in which they may operate and/or for other suitable purposes. In some cases, electrical circuit cards may be mounted within the chassis using standoffs. Standoffs typically have threaded fastening members on both ends such that one end may be screwingly mounted to the chassis while the other end may be screwingly mounted to the electrical circuit card.

SUMMARY OF THE DISCLOSURE

In certain embodiments, a mounting apparatus includes one or more standoffs adapted to maintain two panels at a spaced apart distance from one another. The standoff includes a first end having a first threaded fastening member and a second end having a cavity in which a torque restraining member is disposed. The torque restraining member is coupled to a second threaded fastening member. The relative sizes of the torque restraining member and the cavity allow movement of the torque restraining member within the cavity.

Certain embodiments of the present disclosure may provide one or more technical advantages. For example, certain embodiments may couple electrical circuit cards to chassis without alignment problems caused by the use of multiple standoffs. In many cases, multiple standoffs may be implemented to secure an electrical circuit card to its chassis. Because chassis are often manufactured independently of their associated electrical circuit cards, the spacing between adjacent standoff mount points may be slightly different due to tolerance capabilities of the manufacturing equipment used. In contrast, the standoff according to certain embodiments of the present disclosure may allow movement of the male threaded fastening member relative to the female threaded fastening member to alleviate spacing irregularities between mounting points of the electrical circuit card relative to the chassis to which it is attached.

Certain embodiments of the present disclosure may provide some, all, or none of these advantages. Certain embodiments may provide one or more other technical advantages, one or more of which may be readily apparent to those skilled in the art from the figures, descriptions, and claims included herein.

BRIEF DESCRIPTION OF THE DRAWINGS

To provide a more complete understanding of embodiments of the present disclosure and the features and advantages thereof, reference is made to the following description taken in conjunction with the accompanying drawings, in which.

DESCRIPTION OF EXAMPLE EMBODIMENTS

Figure 1A:
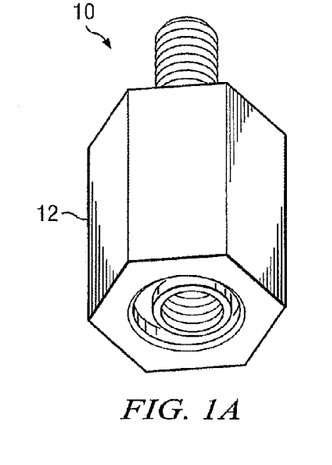
FIGS. 1A, 1B, and 1C illustrate an example standoff according to certain embodiments of the present disclosure.
Figure 1B:
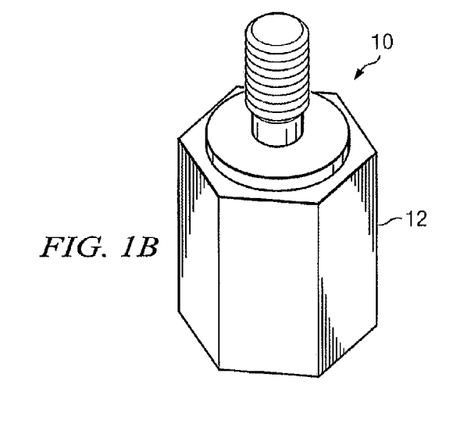
Figure 1C:
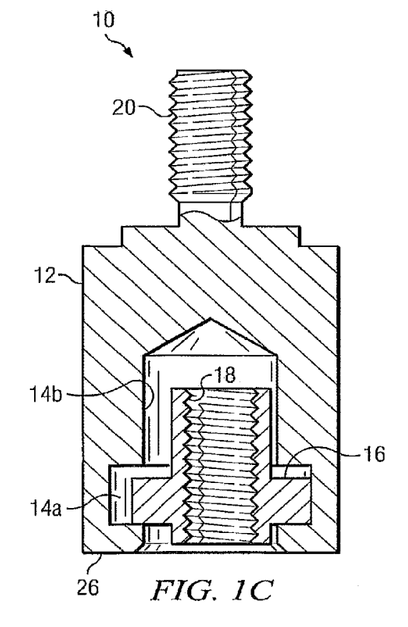
Figure 2:
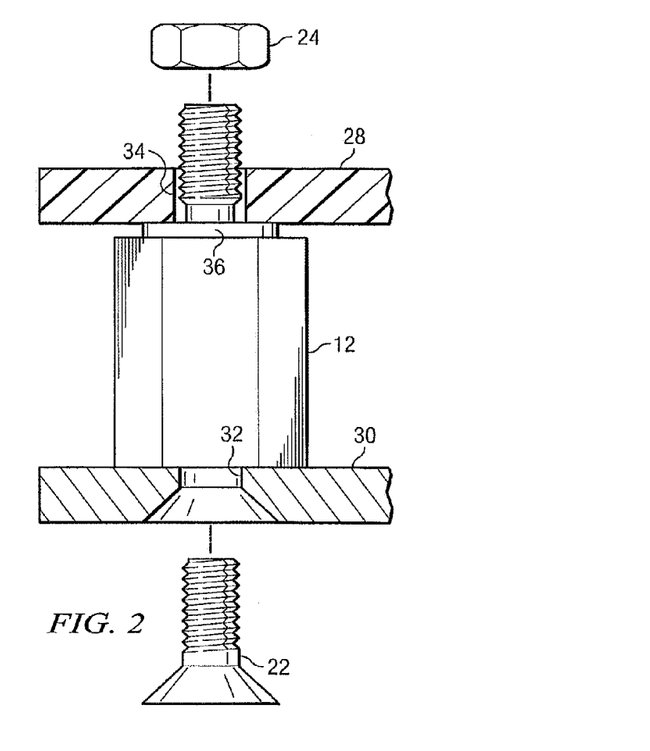
FIG. 2 illustrates how the standoff of FIGS. 1A, 1B, and 1C may be used to mount a circuit card to a mounting plate.

FIGS. 1A, 1B, and 1C illustrate an example standoff 10 according to certain embodiments of the present disclosure. Standoff 10 includes a base portion 12 having a cavity 14*a* and 14*b* into which a torque restraining member 16 is engaged. Torque restraining member 16 is physically coupled to a female threaded fastening member 18 with female threads for coupling to a bolt 22 (FIG. 2). Base portion 12 has a male threaded fastening member 20 with male threads for coupling a corresponding nut 24 (FIG. 2). As will be described in detail below, torque restraining member 16 allows movement of male threaded fastening member 20 relative to female threaded fastening member 18 while restricting rotational movement between the two such that an electrical circuit card may be mounted to another electrical circuit card or to a chassis that houses the electrical circuit card.

Many chassis implementations for housing electrical circuit cards use standoffs for supporting electrical circuit cards inside the chassis. Standoffs rigidly support the electrical circuit cards at a specified distance from the chassis. The distance between the electrical circuit cards and chassis provides clearance for various electronic components configured on the electrical circuit cards and may protect from inadvertent short circuit in cases in which the chassis is formed of a conductive materials such as metal. Nevertheless, mounting of the electrical circuit card in some chassis may be cumbersome due to design constraints of the chassis that houses its associated electrical circuit card.

Certain embodiments of the present disclosure may provide one or more technical advantages. For example, certain embodiments may couple electrical circuit cards to chassis without alignment problems caused by the use of multiple standoffs 10. In many cases, multiple standoffs may be implemented to secure an electrical circuit card to its chassis. Because chassis are often manufactured independently of their associated electrical circuit cards, the spacing between adjacent standoff mount points may be slightly different due to tolerance capabilities of the manufacturing equipment used. In contrast, the standoff 10 according to certain embodiments of the present disclosure may allow movement of male threaded fastening member 16 relative to female threaded fastening member 18 to alleviate spacing irregularities between mounting points of the electrical circuit card relative to the chassis to which it is attached.

The cavity includes a torque restraining member receiving portion 14a and a female threaded fastening member receiving portion 14b. Torque restraining member 16 has a size and shape to fit within the torque restraining member receiving portion 14a with a loose fit. Also, female threaded fastening member receiving portion 14b is sized to allow female threaded fastening member 18 to fit inside with a generally loose fit. In certain embodiments, female threaded fastening member 18 and male threaded fastening member 20 have number 4-40 threads as specified by the Society of Automotive Engineers (SAE). In a particular example, cavity 14a and 14b is sized to allow approximately 0.030 inches of movement of female threaded fastening member 18 relative to base portion 12. In certain embodiments, any suitable amount of clearance may be provided. For example, a standoff 10 having a female threaded fastening member 18 and a male threaded fastening member 20 having a ¼ inch diameter and 20 threads threads-per-inch (¼-20) may have approximately 0.060 inches of movement of female threaded fastening member 18 in base portion 12.

Torque restraining member 16 and torque restraining member receiving portion 14a may have any complementary shape that resists significant rotational movement relative to one another. In the particular embodiment shown, torque restraining member 16 and torque restraining member receiving portion 14a have a generally square shape. In certain embodiments, torque restraining member 16 and torque restraining member receiving portion 14a may have other shapes, such as a triangular shape, a star shape, a hexagonal shape, or other shape adapted to resist significant rotational movement of torque restraining member 16 and torque restraining member receiving portion 14a relative to one another.

Torque restraining member 16 may be entrapped within cavity 14a by a lip 26 of base portion 12. In certain embodiments, lip is integrally formed with base portion 12 using a forging process in which lip 26 is forged from base portion 12 after torque restraining member 16 is inserted into cavity 14a and 14b. In certain embodiments, lip 26 may be implemented using any suitable approach such as by welding lip 26 to base portion 12 after torque restraining member 16 is inserted into cavity 14a and 14b.

Base portion 12, male threaded fastening member 20, and lip 26 may be integrally formed of any suitable material, such as metal or plastic. Also, torque restraining member 16 and female threaded fastening member 18 may be formed of any suitable material, such as metal or plastic.

Threads of female threaded fastening member 18 and/or male threaded fastening member 20 may be of any suitable type. In certain embodiments, threads may include self-locking threads, deformed threads, or nylon inserts.

FIG. 2 illustrates how standoff 10 of FIGS. 1A, 1B, and 1C may be used to mount a circuit card 28 to a mounting plate 30. A flat-head screw 22 is provided that may be inserted through a hole 32 in mounting plate 30 to engage female threaded fastening member 18. Likewise, male threaded fastening member 20 projects through a hole 34 in circuit card 28 for engagement with a nut 24. In certain embodiments, base portion 12 includes a notch 36 proximate circuit card 28. Notch 36 may reduce the effective surface area of base portion 12 contacting circuit card 28. Thus, circuit card 28 may be provided with an additional area for routing copper traces without risk of electrical shorts caused by contact with base portion 12 of standoff 10.

Circuit card 28 and mounting plate 30 merely describe one example of two panels that may be physically coupled to one another. In certain embodiments, standoff 10 may be used to physically couple any suitable type of panel-like component to another panel-like component. For example, standoff 10 may be used to physically couple a circuit card 28 comprising one panel to another panel comprising a chassis in which circuit card 28 is housed.

Figure 3A:
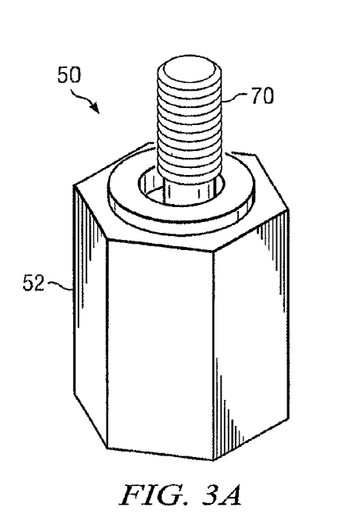
FIGS. 3A, 3B, and 3C illustrate another example standoff according to certain embodiments of the present disclosure.
Figure 3B:
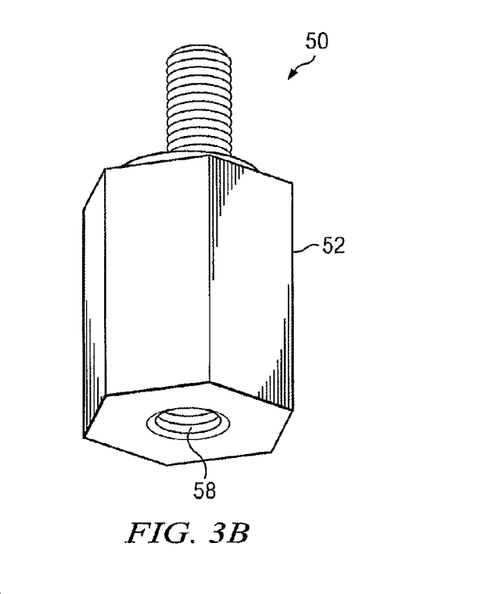
Figure 3C:
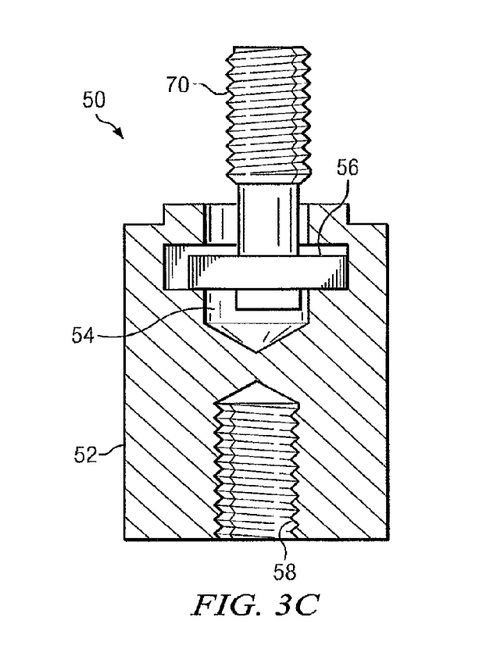

FIGS. 3A, 3B, and 3C illustrates another example standoff 50 according to certain embodiments of the present disclosure. Standoff 50 has a base portion 52 with a cavity 54 into which a torque restraining member is engaged in a similar manner to standoff 10 of FIGS. 1A, 1B, and 1C. Standoff 50 differs from standoff 10, however, in that torque restraining member is physically coupled to a male threaded fastening member 70 with male threads for coupling to a nut, and base portion 52 has a female threaded fastening member 58 with female threads for coupling a corresponding bolt.

Certain embodiments of standoff 10 or 50 may be particularly useful when relatively large quantities of standoffs 10 or 50 are used to couple electrical circuit cards to other electrical circuit cards or to a chassis. Torque restraining member 16 and torque restraining member receiving portion 14a provide a loose fit relatively to one another to compensate for slight miss-alignment of corresponding holes in the electrical circuit cards and/or chassis while resisting rotational movement such that each standoff 10 or 50 may be appropriately engaged using nuts 24 or other suitable attachment components.

Figure 4A:
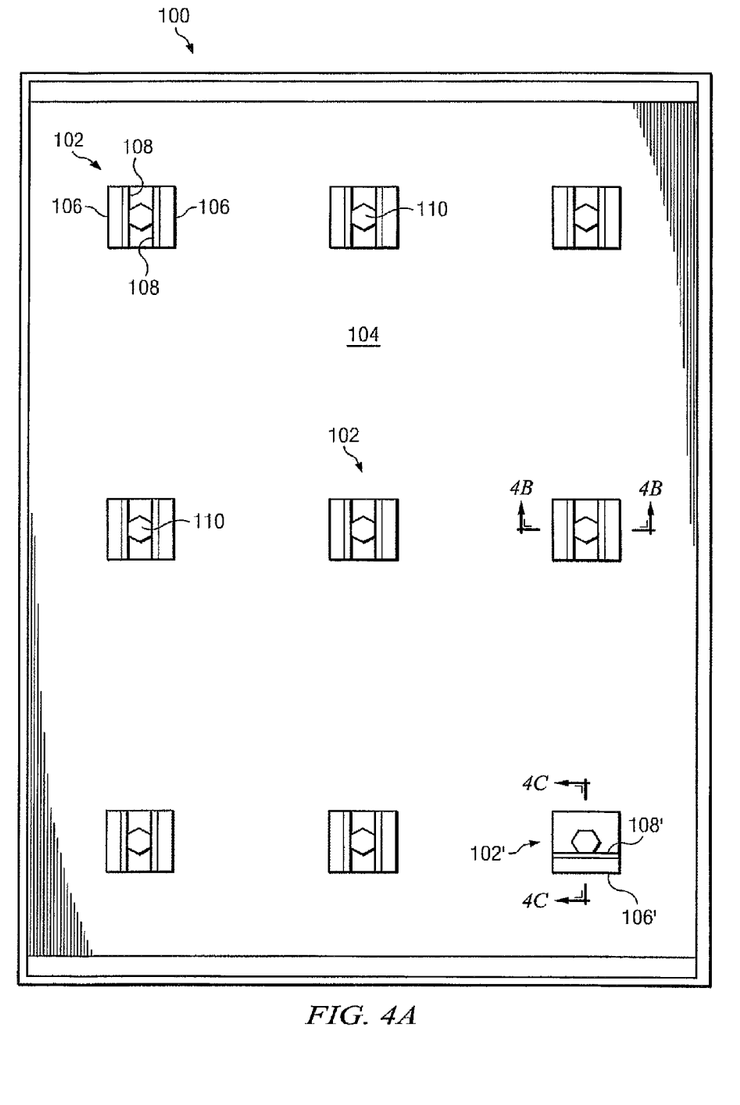
FIGS. 4A, 4B, and 4C illustrate an example standoff mounting system according to certain embodiments of the present disclosure.
Figure 4B:
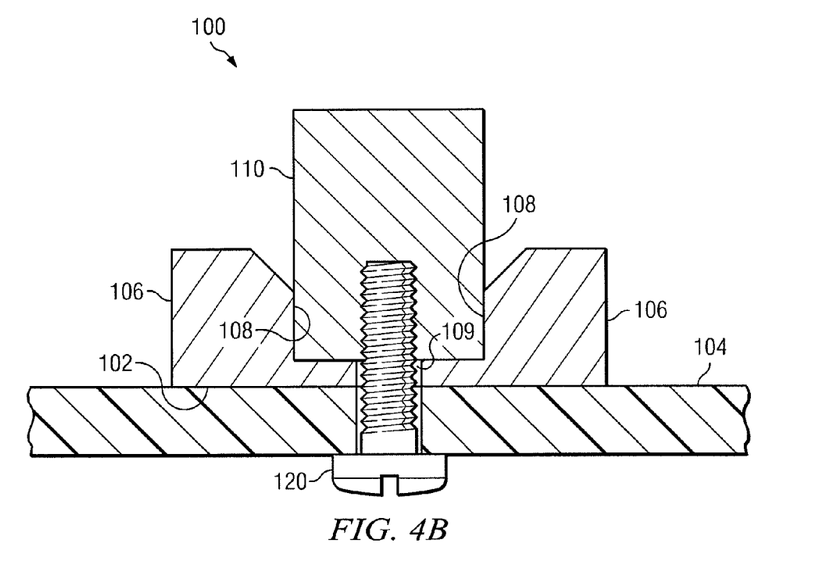
Figure 4C:
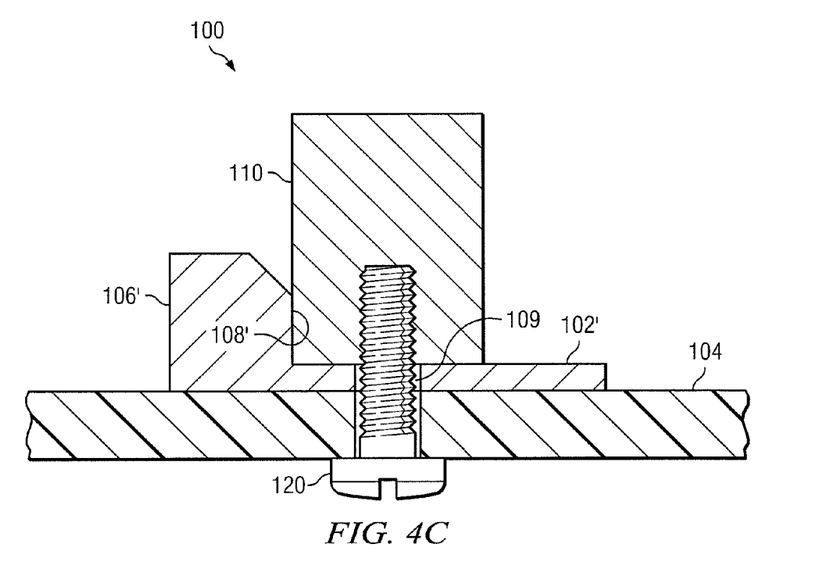

FIGS. 4A, 4B, and 4C illustrate an example standoff mounting system 100 according to certain embodiments of the present disclosure. Mounting system 100 includes multiple torque restraining members 102 configured on a mounting plate 104. Each torque restraining member 102 has at least one projection 106 with a restraining surface 108 that projects outwardly from mounting plate 104. The multiple torque restraining members 102 may be arranged on mounting plate 104 such that when multiple standoffs 110 are each placed adjacent to a corresponding restraining surface 108 of projection 106, restraining surface 108 resists rotational motion of its corresponding standoff 110.

Each projection 106 may be made of any suitable material, such as metal, and is coupled to mounting plate 104 by any suitable approach. In certain embodiments, each torque restraining member 102 has a hole 109 for insertion of a screw 120 for attachment of its associated standoff 110 to mounting plate 104. In the particular embodiment shown, several torque restraining members 102 have projections 106 that are generally linear in shape with two restraining surfaces 108 for restraining the rotational movement of its associated standoff 110, while one torque restraining member 102' has one projection 106' with only one restraining surface 108' that is generally normal to the other restraining surfaces 108. With this configuration, multiple standoffs 110 arranged on a panel, such as a circuit card may be aligned in one direction using the multiple restraining surfaces 108 and aligned in the other direction using the normally oriented restraining surface 108'. In certain embodiments, each restraining surface 108 and 108' may be chamfered along its outer edge to promote ease of insertion of standoffs 110 onto torque restraining members 102.

Figure 5A:
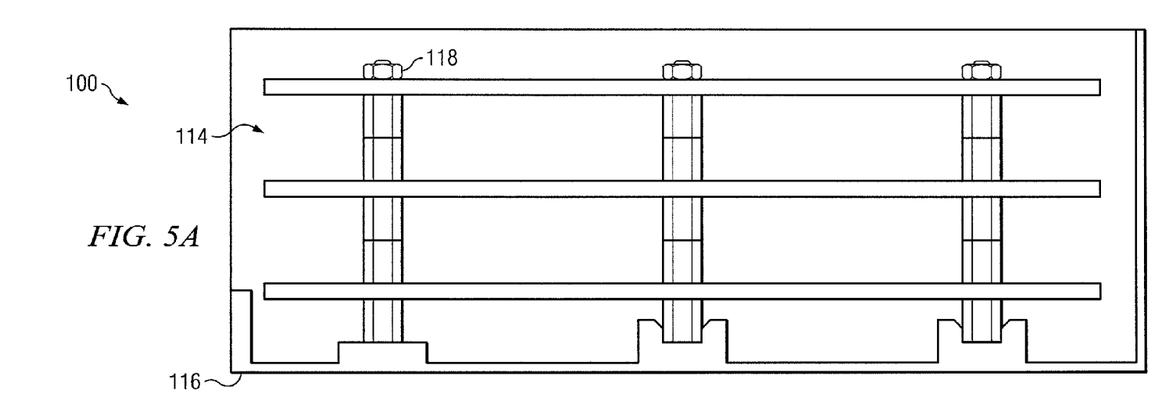
FIGS. 5A and 5B illustrate an example standoff mounting system of FIGS. 4A, 4B, and 4C in which an example circuit card assembly is mounted to an example chassis.
Figure 5B:
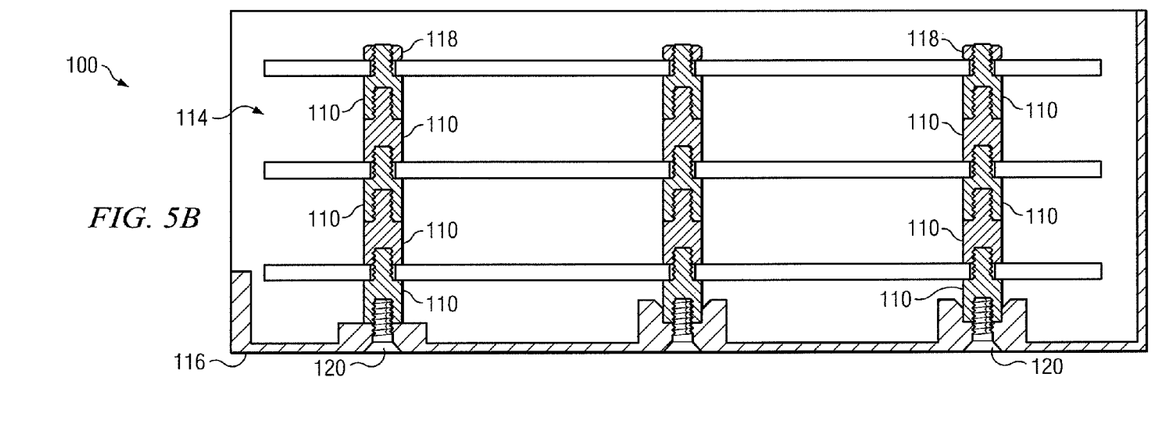

FIGS. 5A and 5B illustrate an example standoff mounting system 100 of FIGS. 4A, 4B, and 4C in which an example circuit card assembly 114 is mounted to an example chassis 116. In this particular example, circuit card assembly 114 includes several individual circuit cards that are arranged above and below one another using a series of standoffs 110. Certain embodiments may provide an advantage in that, when screws 120 are removed from the standoffs 110, the standoffs 110 adjacent to restraining surfaces 108 are restricted from rotation such that other standoffs 110 or nuts 118 are not inadvertently removed due to inconsistent friction forces among the series of standoffs 110.

Figure 6A:
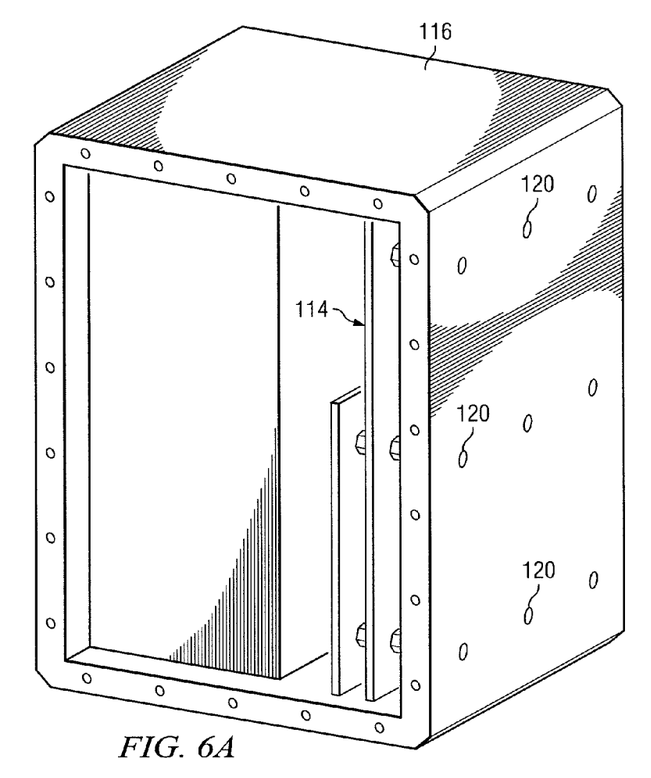
FIGS. 6A and 6B illustrate various views of the circuit card assembly of FIGS. 5A and 5B mounted in a chassis.
Figure 6B:
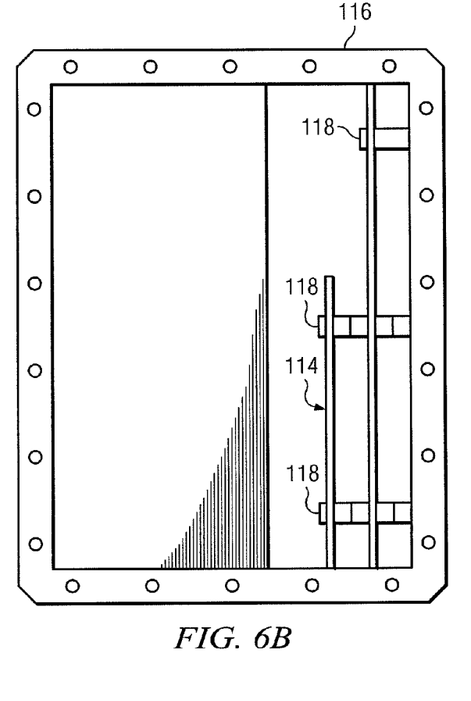

FIGS. 6A and 6B illustrate various views of the circuit card assembly 114 of FIGS. 5A and 5B mounted in chassis 116. As shown, certain conditions may not provide adequate access to nuts 118 and/or standoffs 110 to inhibit their improper rotation when bolts screws 120 are inserted or removed from standoffs 110. Thus, certain embodiments of torque restraining members 102 may provide an advantage by restricting rotational movement of standoffs 110 when they are configured in relatively inaccessible locations such as within a chassis 116 with relatively little working space.

Figure 7A:
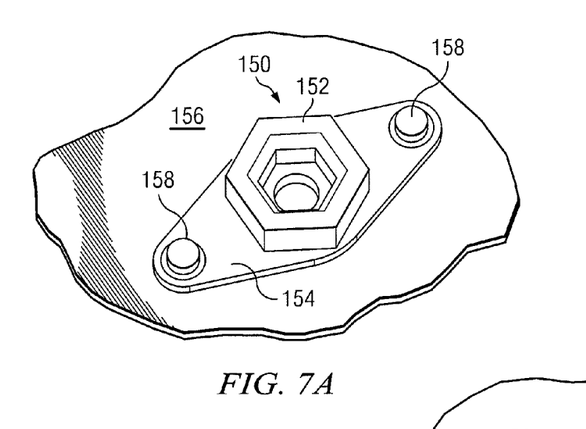
FIGS. 7A and 7B illustrate an example torque restraining member that may be used with the mounting system of FIGS. 4A, 4B, and 4C.
Figure 7B:
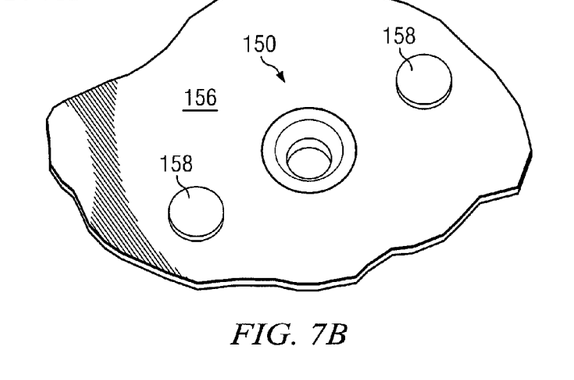

FIGS. 7A and 7B illustrate an example torque restraining member 150 that may be used with the mounting system of FIGS. 4A, 4B, and 4C. Torque restraining member 150 has a restraining surface 152 that is generally hexagonal in shape corresponding to the generally hexagonal shape of certain standoffs. In other embodiments, restraining surface 152 may have any suitable shape that resists rotation of a standoff, such as a square or a star shape. Torque restraining member 150 is attached to a flange 154 with holes for mounting to a panel 156 via fastening devices 158, such as bolts, screws, rivets, and the like.

Figure 8A:
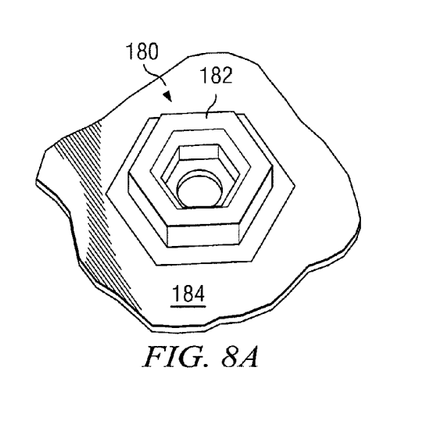
FIGS. 8A and 8B illustrate another example torque restraining member that may be used with the mounting system of FIGS. 4A, 4B, and 4C.
Figure 8B:
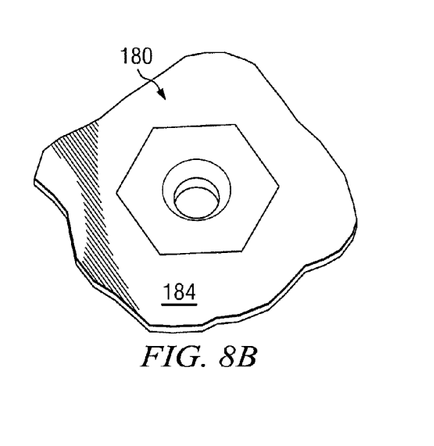

FIGS. 8A and 8B illustrate another example torque restraining member 180 that may be used with the mounting system 100 of FIGS. 4A, 4B, and 4C. Torque restraining member 180 has a restraining surface 182 with a hexagonal shape that is similar to the torque restraining member 150 of FIGS. 7A, 7B, and 7C. Torque restraining member 180 differs, however, in that it is pressed in a panel 184 using a press fit. In certain embodiments, torque restraining member 180 may be mounted to mounting plate 184 using other mounting techniques, such as riveting, swaging, welding, soldering, brazing, or screwing.

Although the present invention has been described with several embodiments, a myriad of changes, variations, alterations, transformations, and modifications may be suggested to one skilled in the art, and it is intended that the present invention encompass such changes, variations, alterations, transformation, and modifications as they fall within the scope of the appended claims.

What is claimed is:

1. A mounting apparatus comprising:
   a standoff having an axis, a first end comprising a first threaded fastening member, and a second end comprising a cavity, wherein the first threaded fastening member comprises male threads configured to engage female threads of a nut; and
   a second threaded fastening member coupled to a torque restraining member that is entrapped in the cavity such that the torque restraining member cannot move out of the cavity, wherein the second threaded fastening member is contained within the cavity and comprises female threads operable to engage male threads of a bolt, wherein the female threads of the second threaded fastening member extend through an interior portion of the torque restraining member;
   wherein relative sizes of the torque restraining member and the cavity define a space that is configured to (i) allow a linear movement of the torque restraining member within the cavity and (ii) restrict the first threaded fastening member from rotating relative to the second threaded fastening member, the linear movement defined as movement of the torque restraining member in a lateral direction relative to the axis of the standoff; and
   wherein the relative sizes of the torque restraining member and the cavity allow at least 0.030 inches of the linear movement of the torque restraining member.

2. The mounting apparatus of claim 1, wherein the torque restraining member and the cavity have a square-shaped periphery along their lateral extent relative to the axis of the standoff.

3. The mounting apparatus of claim 1, wherein the standoff comprises a notch extending around a portion of its periphery proximate the first threaded fastening member.

4. The mounting apparatus of claim 1, wherein:
   the space is also configured to allow a second linear movement of the torque restraining member within the cavity, the second linear movement defined as movement of the torque restraining member in a parallel direction relative to the axis of the standoff, and
   the standoff comprises a lip that extends around a periphery of the cavity and limits an extent of the second linear movement.

5. The mounting apparatus of claim 1, wherein the torque restraining member and the second threaded fastening member are integrally formed of one or more of: plastic or metal.

6. The mounting apparatus of claim 1, wherein at least one of the first threaded fastening member and the second threaded fastening member comprises at least one self-locking thread.

7. A mounting system comprising:
   a plurality of standoffs; and
   an array of torque restraining components, each torque restraining component having at least one restraining surface and a hole, the array of torque restraining components adapted to: engage the plurality of standoffs;
   wherein each standoff comprises:
      a base having:
         an axis;
         a first end comprising a first threaded fastening member, the first threaded fastening member comprising male threads configured to engage female threads of a nut; and
         a second end comprising a cavity; and
      a second threaded fastening member coupled to a torque restraining member that is entrapped in the cavity such that the torque restraining member cannot move out of the cavity, the second threaded fastening member contained within the cavity and comprising female threads operable to engage male threads of a bolt, the female threads of the second threaded fastening member extending through an interior portion of the torque restraining member;
      wherein, in each standoff, relative sizes of the torque restraining member and the cavity define a space that is configured to (i) allow a linear movement of the torque restraining member within the cavity and (ii) restrict the first threaded fastening member from rotating relative to the second threaded fastening member, the linear movement defined as movement of the torque restraining member in a lateral direction relative to the axis of the standoff, wherein the relative sizes of the torque restraining member and the cavity allow at least 0.030 inches of the linear movement of the torque restraining member.

8. The mounting system of claim 7, wherein the array of torque restraining components are integrally formed with a chassis.

9. The mounting system of claim 7, wherein the array of torque restraining components are mounted to a chassis using a physical coupling technique comprising one or more of: riveting, welding, brazing, swaging, press-fitting, soldering, and screwing.

10. The mounting system of claim 7, wherein the at least one restraining surface of each torque restraining component comprises an outer edge having a chamfered shape.

11. The mounting system of claim 7, wherein the at least one restraining surface of each torque restraining component comprises six walls having a hexagonal shape that extends around the hole of the torque restraining component.

12. The mounting system of claim 7, wherein:
at least one of the torque restraining components has a single restraining surface;
others of the torque restraining components have two restraining surfaces forming troughs for insertion of their respective standoffs; and
the single restraining surface of the at least one torque restraining component is perpendicular to the restraining surfaces of the other torque restraining components.

13. A method comprising:
engaging, on an array of torque restraining components, a corresponding plurality of standoffs, each torque restraining component having at least one restraining surface; and
inserting or removing screws to or from, respectively, the plurality of standoffs through holes associated with the array of torque restraining components, each of the plurality of standoffs being restricted from rotating by abutment of its surface with the at least one restraining surface of its respective torque restraining component;
wherein each standoff comprises:
a base having:
an axis;
a first end comprising a first threaded fastening member, the first threaded fastening member comprising male threads configured to engage female threads of a nut; and
a second end comprising a cavity; and
a second threaded fastening member coupled to a torque restraining member that is entrapped in the cavity such that the torque restraining member cannot move out of the cavity, the second threaded fastening member contained within the cavity and comprising female threads operable to engage male threads of a bolt, the female threads of the second threaded fastening member extending through an interior portion of the torque restraining member;

wherein, in each standoff, relative sizes of the torque restraining member and the cavity define a space that is configured to (i) allow a linear movement of the torque restraining member within the cavity and (ii) restrict the first threaded fastening member from rotating relative to the second threaded fastening member, the linear movement defined as movement of the torque restraining member in a lateral direction relative to the axis of the standoff, wherein the relative sizes of the torque restraining member and the cavity allow at least 0.030 inches of the linear movement of the torque restraining member.

14. The method of claim 13, further comprising:
integrally forming the array of torque restraining components on a chassis.

15. The method of claim 13, further comprising:
physically coupling the array of torque restraining components to a chassis using a coupling technique comprising one or more of: riveting, welding, brazing, swaging, press-fitting, soldering, and screwing.

16. The method of claim 13, wherein the at least one restraining surface of each torque restraining component comprises an outer edge having a chamfered shape.

17. The method of claim 13, wherein the at least one restraining surface of each torque restraining component comprises six walls having a hexagonal shape that extends around the hole of the torque restraining component.

18. The method of claim 13, further comprising:
at least one of the torque restraining components has a single restraining surface;
others of the torque restraining components have two restraining surfaces that form troughs for insertion of their respective standoffs; and
the single restraining surface of the at least one torque restraining component is perpendicular to the restraining surfaces of the other torque restraining components.

19. The mounting system of claim 7, wherein the torque restraining member and the cavity in each standoff have a square-shaped periphery along their lateral extent relative to the axis of that standoff.

20. The mounting system of claim 7, wherein each standoff comprises a notch extending around a portion of its periphery proximate the first threaded fastening member of that standoff.

* * * * *